United States Patent [19]
Lilly et al.

[11] Patent Number: 5,200,702
[45] Date of Patent: Apr. 6, 1993

[54] FEED MECHANISM AND METHOD THEREFOR

[75] Inventors: Kevin D. Lilly, Framingham; David G. Cory, Boston, both of Mass.

[73] Assignee: Bruker Instruments, Inc., Billerica, Mass.

[21] Appl. No.: 663,709

[22] Filed: Mar. 4, 1991

[51] Int. Cl.$^5$ ...................... B65G 49/00; G01R 33/46
[52] U.S. Cl. .................................... 324/321; 414/222; 414/224
[58] Field of Search ............... 414/222, 223, 224, 225, 414/226, 332; 324/321

[56] References Cited

U.S. PATENT DOCUMENTS

| | | | |
|---|---|---|---|
| 3,194,389 | 7/1965 | Grgetic | 414/224 X |
| 3,247,980 | 4/1966 | Mickas | 414/224 |
| 3,798,422 | 3/1974 | Foret et al. | 414/224 X |
| 4,091,323 | 5/1978 | Landis | 356/244 X |
| 4,113,083 | 9/1978 | Friese et al. | 414/222 X |
| 4,343,587 | 8/1982 | Aidlin et al. | 414/222 X |
| 4,369,570 | 1/1983 | Madden et al. | 414/222 X |
| 4,581,583 | 4/1986 | Van Vliet et al. | 324/321 |
| 4,654,592 | 3/1987 | Zens | 324/307 |
| 4,765,793 | 8/1988 | Goddeau | 414/222 X |
| 4,832,555 | 5/1989 | Gordon | 414/223 |
| 4,859,948 | 8/1989 | Kuster | 324/318 |
| 4,859,949 | 8/1989 | McKenna | 324/321 X |
| 5,104,277 | 4/1992 | Bullock | 414/222 X |

FOREIGN PATENT DOCUMENTS

| | | | |
|---|---|---|---|
| 62-63846 | 3/1987 | Japan . | |
| 240227 | 9/1989 | Japan | 414/222 |
| WO89/11646 | 11/1989 | PCT Int'l Appl. . | |

*Primary Examiner*—Tom Noland
*Attorney, Agent, or Firm*—Wolf, Greenfield & Sacks

[57] ABSTRACT

Apparatus and method for sequential provision of a series of similarly configured objects to and from a proximal location such as a device for testing those objects. The objects are provided in a gravity-fed stack to a changer that includes a container, a holder slidably disposed in that container and configured to hold a limited number (such as one) of the objects, and a mover or driver for transporting the holder repeatedly between first and second positions within the container. In the first position, the holder is disposed under the stack of objects being fed to receive one of those objects. In the other position, the holder is positioned to gravity feed the object to the proximal location where the object is to be utilized. The holder can be configured with a single space, or with double parallel spaces, each of which can receive one object. For a holder having only one such space, the second position is also utilized to permit ejection of the used object, by an appropriate force, from the proximal location. For a holder having two such spaces, the first position is utilized for such ejection, so that receipt of another one of the objects can take place while or even before the fed object is so ejected.

17 Claims, 5 Drawing Sheets

FEED MECHANISM AND METHOD THEREFOR

FIELD OF THE INVENTION

The present invention relates to apparatus and method for repeatedly inserting and removing a succession of objects into a utilization device, particularly where those objects are substantially identically configured.

BACKGROUND OF THE INVENTION

In the field of automated measuring and testing equipment, one problem that must be addressed is the provision of test samples to, and removal of tested samples from, such equipment. A sample is inserted in the tester, which then automatically performs various tests, and the sample is then removed after testing and replaced with another sample. Sample changing can be done by hand. However, manual changing is slow, can result in contamination of the samples and requires the presence of an operator which partially defeats the purpose of automating the test equipment.

Accordingly, in the field of materials testing, it has been a general practice to employ automated devices for acquisition of a sample to be tested, transport of that sample to a testing apparatus, retrieval of the tested sample from the testing apparatus, and finally return of the sample whence it came or else provision of the tested sample to appropriate disposal. Often, such devices, particularly owing to their automatic nature, are designed or adapted to engage, transport and release samples of a predetermined size.

One example of a such a prior art automated testing device which handles predetermined size samples is a nuclear magnetic resonance (NMR) spectrometer, which includes a magnet chamber and a cylinder. Samples of material to be tested by the NMR spectrometer must be conveyed into the interior of the magnet chamber and, to that end, a sample is dropped into the cylinder and falls therethrough into the magnet chamber. After testing, the sample is ejected from the magnet chamber by any of various mechanisms.

An illustrative example of a magnet chamber 113 and a sample changer 117 for such an NMR spectrometer is shown in FIG. 8. Such a device is typical of NMR spectrometers available from Bruker Instruments, Inc., Billerica, Mass. Magnet chamber 113 is provided with a cylinder 115. Material samples are tested in magnet chamber 113 and such samples are inserted in and removed from chamber 113 via cylinder 115.

Magnet chamber 113 can be used for testing samples of both solid and liquid materials. Liquid samples are contained in sample holders made of glass which are easily broken. Consequently, it is necessary to handle the sample containers firmly but gently. Liquid sample holders are illustratively handled by material handling apparatus 117 which includes a vertical cylinder 119 and piston 121 mounted on a rotatable arm 123. The lower end of piston 121 is provided with a pneumatically controlled pincher 137 for picking up and carrying a liquid sample holder. Arm 123 is rotatably supported on motorized pole 125 by upper and lower fixture rings 127 and 129 each connected to arm 123, and by resting ring 131 on which lower fixture ring 129 rests. Pole 125 is also provided with a pipe or tube 133 which supports magazine belt 135. Magazine belt 135 is configured to hold a plurality of liquid samples, and is rotated with rotation of pipe 133 so that different samples can be presented at different times to pincher 137. Cabinet 139 provides controls for movement of pipe 133 and pole 125. Pincher 137 with cylinder 119 and piston 121 can be moved horizontally or radially along arm 123, and may be moved azimuthally by swinging of arm 123 by rotation of pole 125 caused by cabinet 139. Pincher 137 is connected to the lower end of piston 121, and can be controlled to open and close about a liquid sample at belt 135 and cylinder 115. Cylinder 119, piston 121, arm 123 and pole 125 can thereby move pincher 137 between belt 135 and cylinder 115. Once the sample holders are inserted into cylinder 115, they are conveyed pneumatically to the interior of magnet chamber 113 and subsequently pneumatically ejected from chamber 113 after testing is completed.

The material handling apparatus 117 functions well to handle the delicate liquid sample holders. Apparatus 117 can also be modified to handle solid sample holders to enable the spectrometer to automatically test such samples. Typical solid sample holders are considerably smaller than liquid sample holders and are much more rugged. In particular, as shown in FIG. 9, solid samples are typically disposed in a holder 151 which includes cap 147 and hollow ceramic tube 149. In one version of holder 151, cap 147 is tightly press-fitted on tube 149 whose opposite end is closed. Once inside magnet chamber 113 of the spectrometer, in accordance with well known NMR spectroscopy techniques, holder 151 is rapidly rotated by compressed air and, for this reason is called a "rotor".

Apparatus 117 is obviously complicated and expensive and well-suited to handling fragile holders such as the liquid sample holders. Since the ceramic solid sample rotors are much more rugged than the glass liquid sample holders, it is no longer necessary to use the aforementioned complicated pincher mechanism to delicately transport the rotors between a moving supply belt or other source of supply and the spectrometer, if that were possible.

Accordingly, there is a need for a sample changer providing rapid, easy changing of samples of solid material to and from a device that tests such samples. The present invention fulfills that need.

SUMMARY OF THE INVENTION

Accordingly, it is the general purpose of the present invention to provide apparatus and method for repeated exchanging of similarly configured objects at a predetermined location.

Other objects of the present invention are to provide apparatus and method for sequentially inserting and removing solid samples to and from a material tester.

Further objects of the present invention are to provide a sample changer for an NMR spectrometer which treats rotors for solid samples as if they are robust, not fragile, devices.

Briefly, these and other objects of the present invention are accomplished by an apparatus wherein a plurality of similarly configured objects are provided in a gravity fed stack to a changer that includes a container, a holder slidably disposed in that container, and a mover for transporting the holder between two positions within the container. The mover can be disposed within or outside of the container, and can be a two-way pneumatic valve, a driven rod having detents for defining the two positions, a motor, a solenoid or any other suitable device. In one of the two positions, the holder is disposed under the stack of objects being fed to receive one of those objects. In the other position, the holder is positioned to gravity feed the object to a location where it is to be utilized. The holder can be configured with a single location, or with two parallel locations, each of which can receive one object. For a single-location holder, the second position is also utilized to permit ejection of the used object, by an appropriate force, from the using location. For a two location holder, the first position is utilized for the purpose, so that receipt of another one of the objects can take place while or even before the fed object is so ejected.

The present invention is furthermore accomplished by shifting such objects mechanically into and out of an air stream or other fluid stream. Such objects are furthermore accomplished in the present invention by treating such objects as robust as opposed to fragile devices, by collecting such objects by permitting one such object to impact another.

Other objects, advantages and novel features of the invention will become apparent from the following detailed description of the invention when considered in conjunction with the accompanying drawings.

DESCRIPTION OF THE PREFERRED EMBODIMENTS

Figure 1:
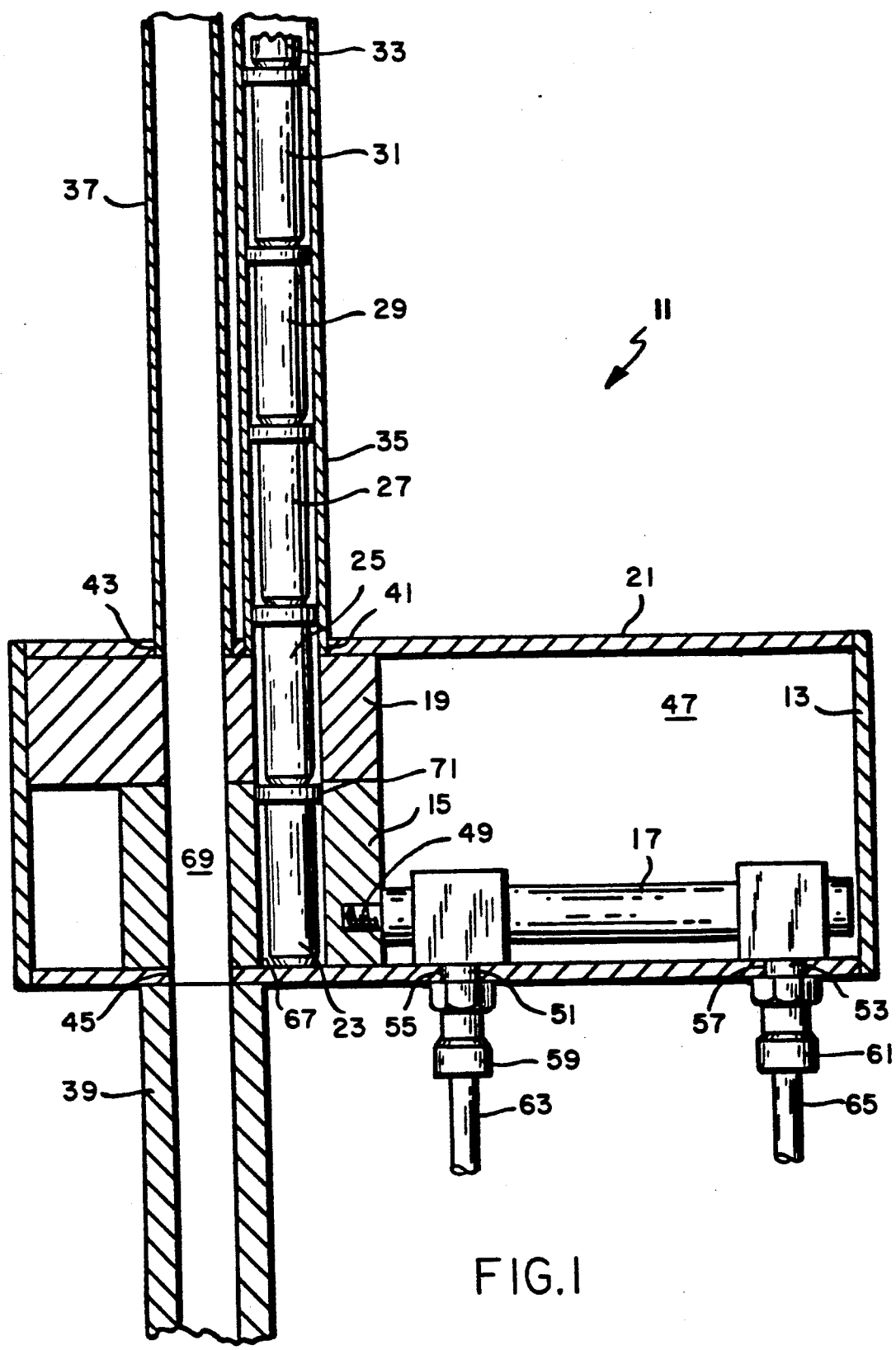
FIG. 1 shows a sectional view of one embodiment of a sample changer according to the present invention and shown in one operating position.
Figure 8:
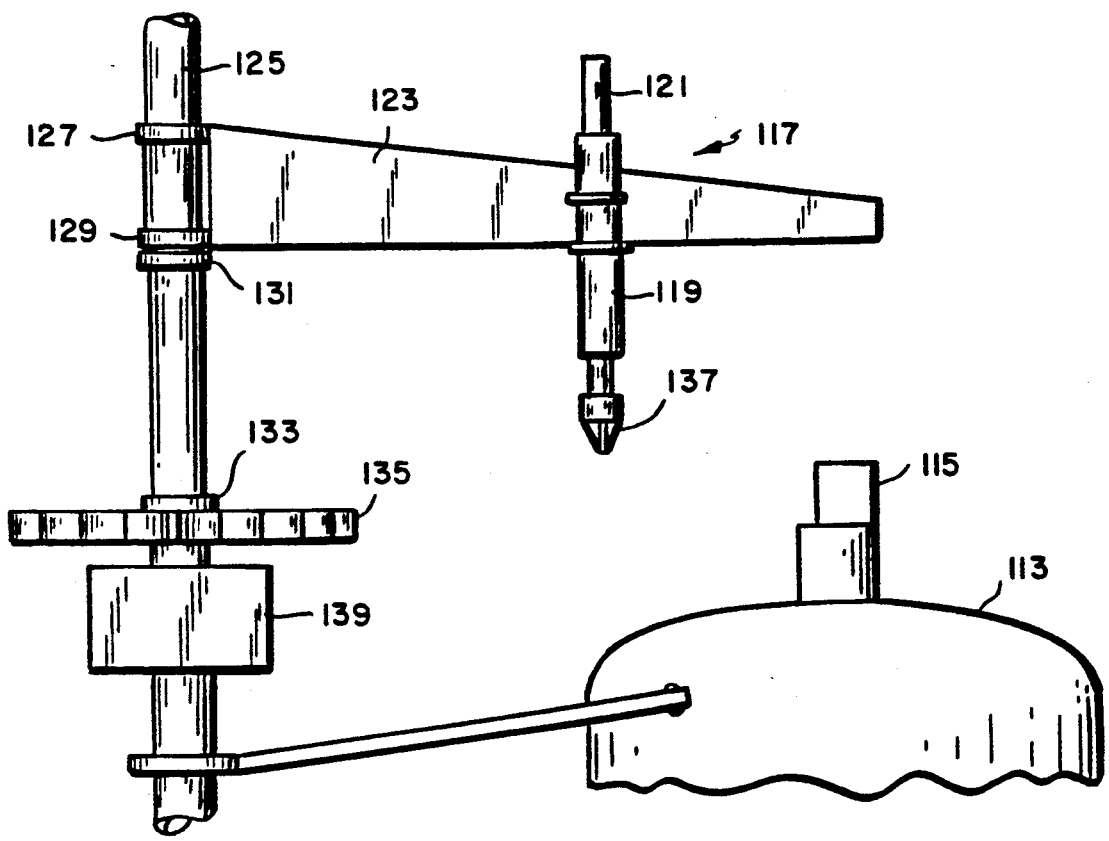
FIG. 8 shows a side elevation of a prior art material handling and testing apparatus.
Figure 9:
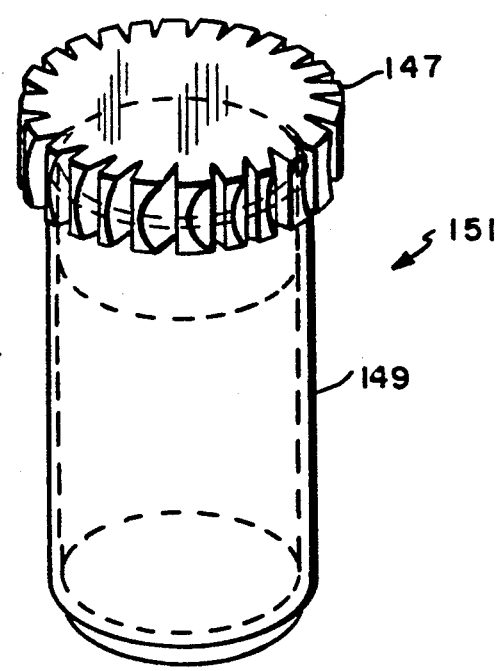
FIG. 9 illustrates a prior art holder for material samples to be tested, for which the apparatus of FIGS. 1-7 is particularly well suited.

Referring now to the drawings, wherein like reference characters designate like or corresponding parts throughout the several views, there is shown in FIG. 1 a sample changer 11 including a case 13 which is suitable for use with the NMR spectrometer described above in connection with FIGS. 8 and 9. Disposed within case 13 are holder 15 slidably disposed in the case, two-way pneumatic drive 17 connected to and driving the holder, and spacing block 19 spacing the upper wall 21 of the case away from holder 15 so that the next lowest sample rotor 25 of sample rotors 23-33 can enter the case. However, inclusion of block 19 in the apparatus of FIG. 1 is not absolutely necessary; instead, upper wall 21 could be disposed just above and in slidable contact with holder 15.

Figure 2:
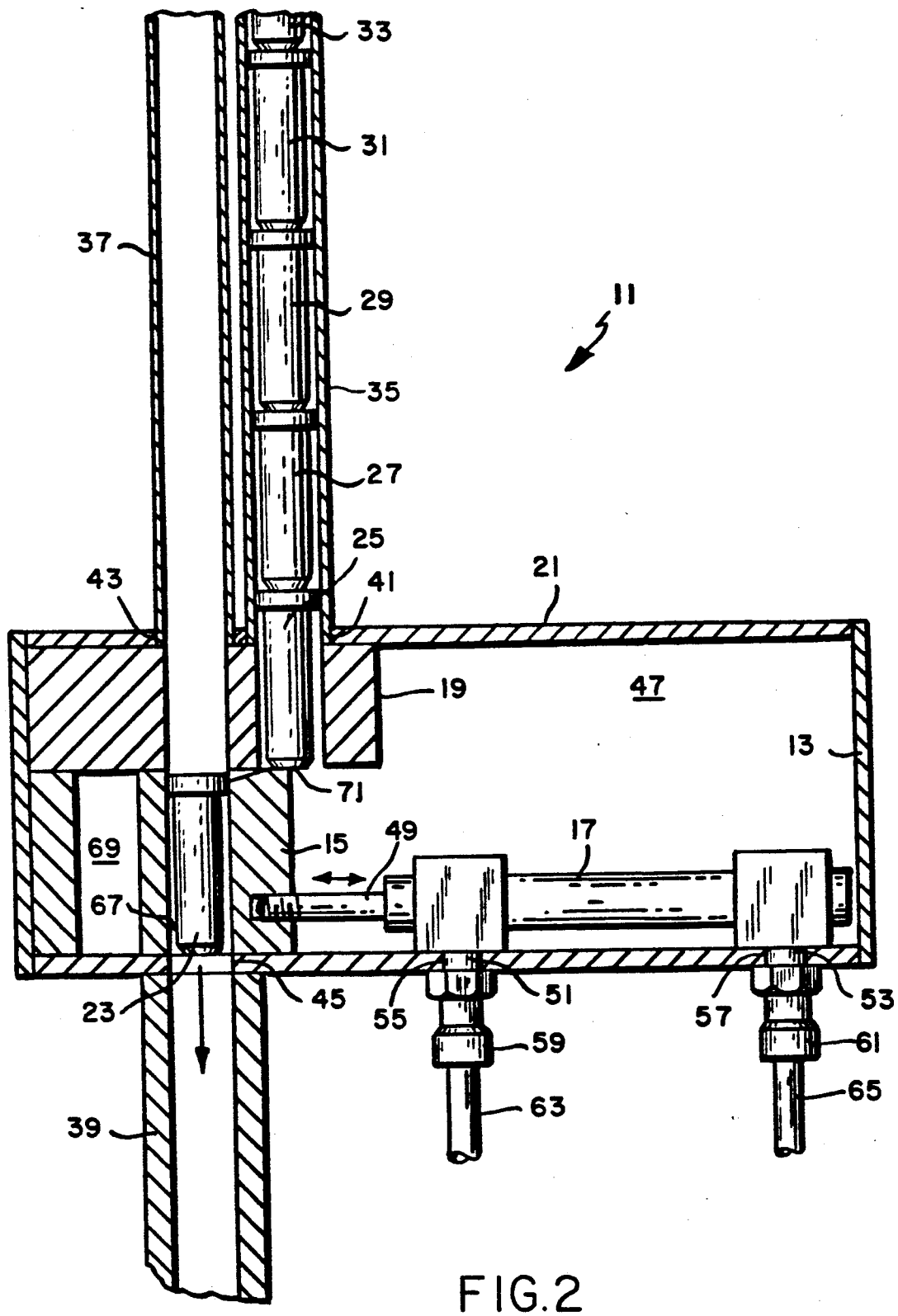
FIG. 2 is a sectional view of the apparatus of FIG. 1 shown in a second position of operation.

Sample changer 11 further includes feed tube 35, eject tube 37 and insertion tube 39, each engaging or otherwise connected to a corresponding opening 41, 43 or 45 of case 13. Holder 15 is slidably disposed in interior chamber 47 of case 13, and is moved between a first position (shown in FIG. 1) and a second position (shown in FIG. 2) by drive 17. Drive 17 is typically provided with a piston 49, and is provided with two input ports 51 and 53 for receipt of compressed air or other fluid, each for moving that piston in one of the two directions shown in FIG. 2. For example, application of compressed air at port 53 would result in sideways movement of holder 15 from the first position of FIG. 1 to the second position of FIG. 2. Also, input of compressed air at port 51 would move holder 15 to the right as shown in FIGS. 1 and 2, for example, from the second position of FIG. 2 to the first position of FIG. 1. Case 13 is provided with respective openings 55 and 57 for ports 51 and 53. A respective connector 59 and 61 connects respective ports 51 and 53 to respective pneumatic lines 63 and 65. Case 13, holder 15 and block 19 can, for example, each be of aluminum. Tubes 35, 37 and 39 can, for example, each be of brass.

Figure 3:
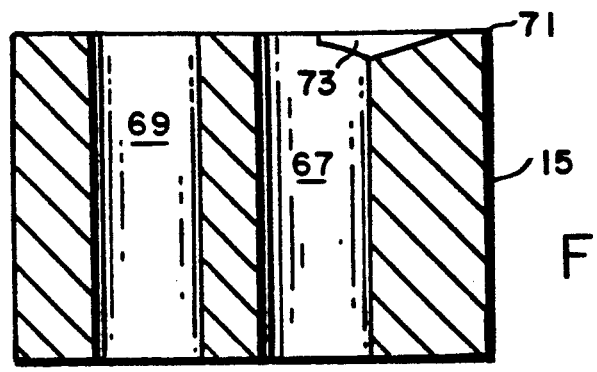
FIG. 3 is a sectional view of a portion of the apparatus of FIGS. 1 and 2 more clearly showing details thereof.
Figure 4:
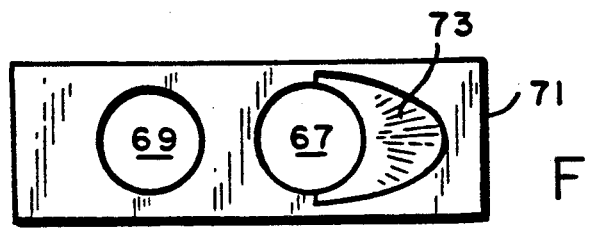
FIG. 4 is a top view of the portion of FIG. 3.

Operation of the embodiment of FIGS. 1 and 2 will now be described. Rotors 23-33, each holding a sample of solid material to be tested, are inserted into and stacked in feed tube 35. If holder 15 is in the first position of FIG. 1, then the lowest rotor 23 will enter compartment 67 of holder 15. Otherwise, the lowest rotor would enter block 19, but would be held above holder 15 by its edge 71 until drive 17 moves the holder to the first position. After the lowest or bottom rotor 23 has entered compartment 67 of holder 15, and when the spectrometer 111 or other device is ready to receive a sample for testing, compressed air from line 65 closes drive 17 to urge the holder leftwards to the second position of FIG. 2. In the position of FIG. 2, rotor 23 would simply drop via opening 45 and insertion tube 39 into the spectrometer. Preferably, compressed air from line 63 would close drive 17 to move holder 15 rightwards to the first position of FIG. 1 so that the next rotor 25 can enter compartment 67. In order to avoid any problems with a rotor catching on the upper entrance to compartment 67 and thereby interfering with proper movement of holder, 15 and proper entry of the rotor therein, holder 15 is furthermore provided with bevelled or sloped 73, which is more clearly shown in FIGS. 3 and 4, and slopes or inclines into compartment 67. When spectrometer 111 has finished testing rotor 23, it ejects that rotor using a blast of compressed air. That blast of ejection air causes the tested rotor to pass through insertion tube 39, compartment 69 and eject tube 37. For this reason, eject tube 37 and insertion tube 39 are aligned.

The holder or slider 15 has two holes 67 and 69 through it, which are the same diameter as tubes 35, 37 and 39. In its rest or first position, these two holes are respectively positioned directly below the feed 29 and ejection 37 tubes. Feed tube 35, as discussed above, is filled with rotors, stacked one on top of the other. Due to gravity, the bottom rotor 23 will fall into hole 67 and slider 15. In order to insert a rotor into spectrometer 111, pneumatic pressure is applied to piston 49, closing the piston to push the slider away from it. This positions the rotor, which is in slider 15, over insert tube 39. Due to gravity, the rotor falls into the spectrometer. In order to eject the tested rotor, pneumatic pressure is applied to the other side of piston 49, causing it to return slider 15 to its rest position. A second hole 69 in slider 15 permits the tested rotor, under pneumatic pressure from the spectrometer, to pass from insert tube 39 through hole 69 to eject tube 37 and out of changer 11. At the same time, another rotor can fall from feed tube 35 into slider 15. There are a number of possibilities for catching the ejected rotor. A simple basket of netting may be attached to eject tube 37, or a more elaborate structure may be devised to drop the tested rotor into a catch basin or collection tube.

A second embodiment of the present invention is shown in FIGS. 5A-5D in various positions and various stages of operation. This sample changer 75 is primarily differentiated from sample changer 11 of FIGS. 1-4 in that it includes a holder or slider 77 having only one compartment or hole 79 for receiving rotors 23-27. Like sample changer 11, sample changer 75 includes a case 81 with an interior chamber 83, a spacing block 85, a feed tube 87, an eject tube 89 and an insertion tube 91. Although no drive such as drive 17 of FIGS. 1 and 2 is shown in FIGS. 5A-5D for simplicity, it will be appreciated that some such drive is needed to move slider 77 between its first position of FIGS. 5A and 5D and its second position of FIGS. 5B and 5C. As with insertion tube 39 of FIGS. 1 and 2, insertion tube 91 of FIGS. 5A-5D is connected to, or is disposed at least partially within, a spectrometer or other testing device such as within magnet chamber 113 of an NMR spectrometer.

Figure 5A:
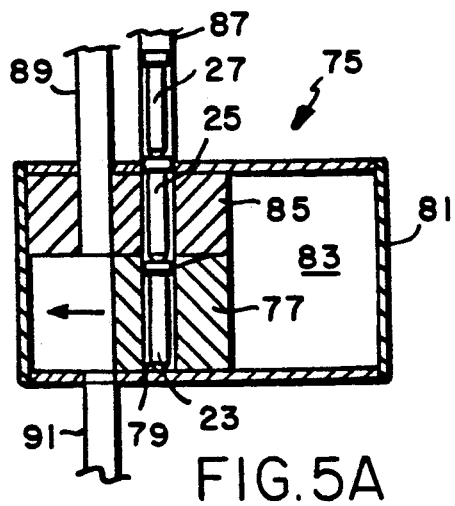
FIG. 5A is a sectional view of another embodiment of a sample changer according to the present invention shown in a first operating position during a first stage of operation.
Figure 5B:
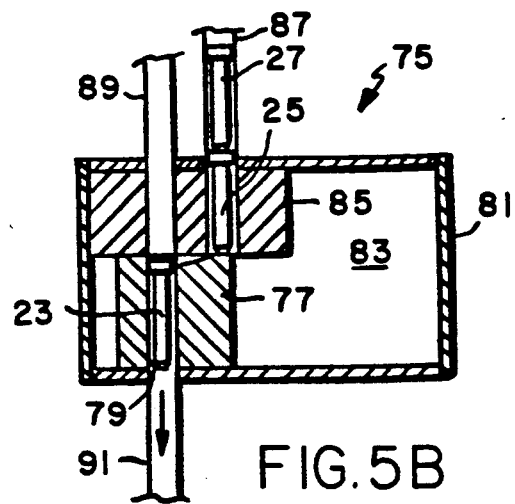
FIG. 5B is a like sectional view of the apparatus of FIG. 5A shown in a second operating position during a second stage of operation.
Figure 5C:
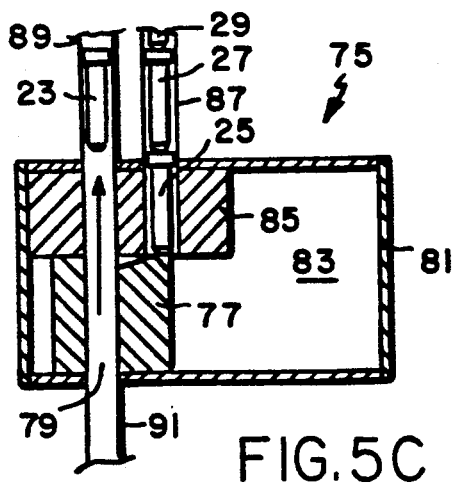
FIG. 5C is a like sectional view of the apparatus of FIG. 5A shown in the second operating position of FIG. 5B but in a third stage of operation.
Figure 5D:
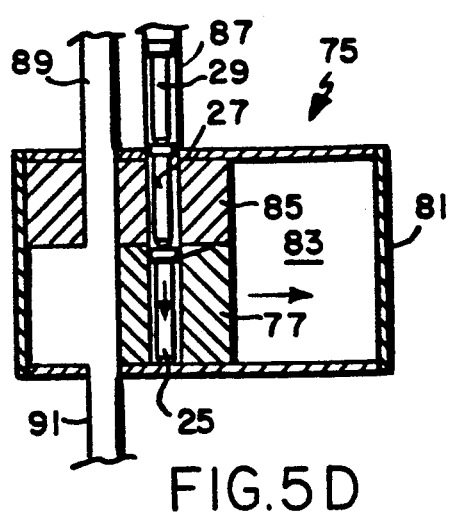
FIG. 5D is a like sectional view of the apparatus of FIG. 5A shown in the first operating position but during a fourth stage of operation which leads to the first stage of operation of FIG. 5A.

Operation of the embodiment of FIGS. 5A-5D will now be described. In the following description of operation, slider 77 is being moved by a suitable mover or driver (not shown) controlled by a suitable pair of input ports having feed lines connected thereto (also not shown). Operation is preferably initiated in the position of FIG. 5A. Again, a plurality of rotors 23, 25, 27, etc. is inserted into feed tube 87 in a stack with the bottom rotor 23 entering bore 79 of slider 77. Slider 77 is then moved leftwards into its second position of FIG. 5B. In the position of FIG. 5B, gravity or other suitable force causes rotor 23 to drop through insertion tube 39 into the testing device for testing. As shown in FIG. 5C, slider 77 remains in its second position during ejection of rotor 23 from magnet chamber 113 or other testing device. As described above, after the NMR spectrometer has finished testing a rotor in magnet chamber 113, it ejects that rotor with a blast of compressed air. Tested rotor 23 when ejected thereby is impelled through insertion tube 91, bore 79 and eject tube 89. Thereafter, as shown in FIG. 5D, slider 77 is moved rightward into its first position so that the next rotor 25 can drop into bore 79. The cycle of FIGS. 5A-5D is then repeated, this time with rotor 25 being tested.

Although a pneumatic drive is shown as drive 17 in FIGS. 1 and 2, it should be understood that any sort of drive can be utilized with the present invention. For example, drive 17 could be replaced with a piston or a rod having the appropriate detents to limit its movement between what would correspond to the first and second positions of the slider 15 or 77. Alternatively, a solenoid, a hydraulic actuator, a motor, or any other suitable moving or impelling device could be utilized to move slider 15 or 77 between its first or second positions. However, a pneumatic drive is preferred for this purpose, to take advantage of the compressed air used for insertion and ejection of rotors in magnet chamber 113. For example, for the embodiment of FIGS. 1-4, the compressed air used for insertion of a rotor in magnet chamber 113 could also be provided to line 63, and the compressed air used for ejection of a rotor from the spectrometer could also be provided to line 65. In this way, positioning and movement of slider 15 could be coordinated with operation of the NMR spectrometer, resulting in fully automatic operation. For example, a stack of rotors could be loaded into feed tube 27, the NMR spectrometer could then be turned on, and the apparatus left to operate over the weekend with no human attendant required.

Figure 6:
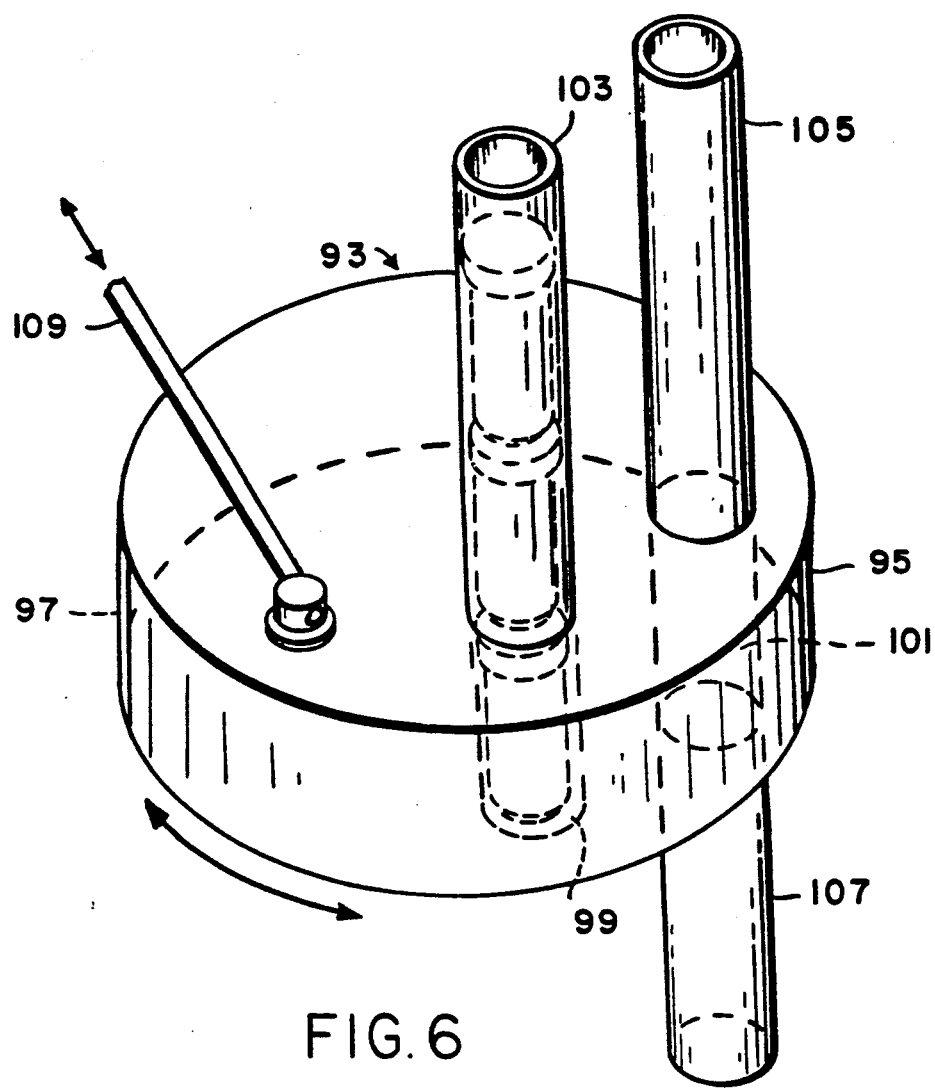
FIG. 6 is an orthogonal view of a third embodiment of a sample change according to the present invention with certain portions hidden in that view shown with broken lines.

A third embodiment of the present invention is shown in FIG. 6. In this third embodiment, sample changer 93 includes a cylindrical or drum shaped case 95 containing a disk 97 provided with bores 99 and 101. Sample changer 93 further includes feed tube 103, eject tube 105, and insertion tube 107. Disk 97 is pivotably rotated within cylinder 95 between a first position as shown in FIG. 6 with bore 99 being disposed below feed tube 103, and a second position counterclockwise from the first position wherein bore 99 is disposed in alignment with eject tube 105 and insertion tube 107. Such movement is accomplished by suitable drive means (not shown), but which can be controlled via an electric or other line 109, a pair of pneumatic lines (not shown), or other suitable means. Otherwise, operation of the embodiment of FIG. 6 is similar to that of the embodiment of FIGS. 1-4.

Figure 7:
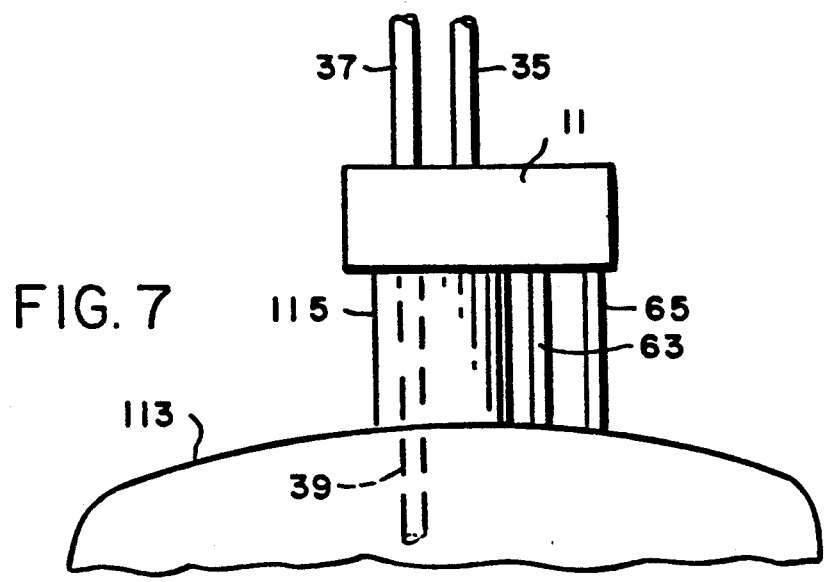
FIG. 7 shows a side elevation of a portion of a prior art NMR spectrometer showing a sample changer according to the present invention installed thereon.

As shown in FIG. 7, sample changer 11 (or for that matter, sample changer 75 or sample changer 93) is disposed atop cylinder 115 which in turn is atop magnet chamber 113. Insertion tube 39 (or insertion tube 91, or insertion tube 107) is inserted into magnet chamber 113 via cylinder 115. Pneumatic lines 63 and 65 for control of drive 17 (or the corresponding drives of sample changer 75 or sample changer 93) are connected to spectrometer 111 for provision of compressed therefrom as described above, preferably.

Some of the many advantages of the present invention should now be readily apparent. For example, novel apparatus and method have been provided for repeated exchanging of similarly configured objects at a predetermined location. This apparatus and method can be used for sequentially inserting and removing solid samples to and from a device for testing such samples. In particular, a sample changer has been shown which can be used with an NMR spectrometer or other testing device which treats rotors or other holders for solid samples as if they were robust, not fragile devices. Utilizing the apparatus and method of the present invention, it is possible to provide automatic feed and ejection of samples to and from a testing device, thereby permitting unattended automatic operation of that testing device for extended periods of time. The apparatus and method of the present invention provides rapid, easy, automatic changing of samples to and from a device that tests such samples.

Obviously, many modifications and variations of the present invention are possible in light of the above teachings. It is, therefore, to be understood that the foregoing embodiments are presented by way of example only and that, within the scope of the appended claims and equivalents thereto, the invention may be practiced otherwise than as specifically described.

What is claimed is:

1. Apparatus for sequential provision of a plurality of similarly configured objects to a predetermined location in a test chamber wherein the contents of one of said objects is tested, said apparatus comprising:
    a container;
    a member slidably disposed in that container and provided with a plurality substantially parallel passageways therethrough, wherein each of said passageways is configured to fully contain only one of the objects;
    moving means for moving said member repeatedly between first and second positions in said container;
    feed means connected to and opening into said container for sequentially providing the objects to said container and to a first one of said passageways when said member in said first position;
    provision means connected to said container for delivering the object in said first passageway from the container when said member is in said second position; and
    escape means, connected to said container and aligned with said provision means, for providing an escape path from said container for the objects through a second of said passageways when the objects are returned from said provision means;
    wherein in said first position said first passageway of said plurality of passageways is aligned with said feed means such that an object can be fed from said feed means to said first passageway and such that when the object is returned from said provision means, a substantially unrestricted path is provided for the returned object through the alignment of said second passageway and said escape means, whereby returned objects can pass through said second passageway and said escape means and do not block proper operation of said apparatus; and
    wherein said first passageway in said second position is aligned with said provision means such that the object in said first passageway can be provided to said provision means.

2. Apparatus as recited in claim 1 wherein movement of said member from said first position to said second position is reverse of movement of said member from said second position to said first position.

3. Apparatus for sequential provision of a plurality of similarly configured sample holders to a predetermined location, said apparatus comprising:
    a container;
    a member slidably disposed in that container and provided with at least one space therein, wherein said space is configured to fully contain only one of the sample holders;
    moving means for moving said member repeatedly between first and second positions in said container;
    feed means connected to and opening into said container for sequentially providing the sample holders to said container and to the space in said member;
    provision means, connected to said container, for providing the sample holder from the container to said location; and
    escape means connected to said container and aligned with said provision means for providing an escape path rom said container for the sample holders when the sample holders returned from said provision means;
    wherein the space in said first position is aligned with said feed means such that a sample holder can be fed from said feed means to said space; and
    wherein said space in said second position is aligned with said provision means and with said escape means such that the sample holder in the space can be provided to said provision means, and such that if the sample holder is returned to said provision means, than a substantially unrestricted path is provided for the returned sample holder through said provision means, said space of said member and said escape means, whereby returned sample holders are removed and do not block proper operation of said apparatus.

4. Apparatus as recited in claim 3 wherein movement of said member from said first position to said second position is reverse of a movement of said member from said second position to said first position.

5. Apparatus for supplying test samples to an automatic NMR spectrometer, each sample being contained in one of a plurality of similarly configured rotors, comprising:
    a rotor magazine for holding the plurality of rotors,
    a chute for delivering the rotors to the spectrometer,
    a rotor ejection apparatus for ejecting rotors from the spectrometer after an NMR spectrum has been obtained, and means for sequentially feeding the rotors one at a time from the rotor magazine to the chute including;
        a sliding transfer member provided with at least one rotor space sized to hold only one rotor at a time, and
        means connected to the transfer member for repetitively oscillating the transfer member between the rotor magazine and the chute so that a single rotor is removed from the rotor magazine and dropped into the chute during each oscillation.

6. In a sample feeding apparatus for an automatic NMR spectrometer, the improvement according to claim 5 wherein the rotor magazine has a holder that holds the plurality of rotors end-to-end in a vertical stack and the sliding transfer member comprises a body with a vertical hole therethrough that allows one rotor in the rotor magazine stack to drop into the vertical hole.

7. In a sample feeding apparatus for an automatic NMR spectrometer, the improvement according to claim 6 wherein the oscillating means comprises means connected to the transfer member for moving the vertical hole from a first position under the rotor magazine stack to a second position over the chute to allow the rotor in the vertical hole to drop into the chute.

8. In a sample feeding apparatus for an automatic NMR spectrometer, the improvement according to claim 7 wherein the transfer member has a second hole located therein so that when the vertical hole is in the first position, the second transfer member hole aligns with the chute.

9. In a sample feeding apparatus for an automatic NMR spectrometer, the improvement according to any one of claim 5-8 wherein the oscillating means comprises means for moving the transfer member linearly between the rotor magazine and the chute.

10. In a sample feeding apparatus for an automatic NMR spectrometer, the improvement according to any one of claim 5-8 wherein the oscillating means comprises means for rotating the transfer member between the rotor magazine and the chute.

11. In a sample feeding apparatus for an automatic NMR spectrometer, the improvement according to any one of claim 5-8 wherein the transfer member has a thickness substantially equal to the length of each sample rotor.

12. In a sample feeding apparatus for an automatic NMR spectrometer, the improvement according to any one of claim 5-8 wherein the oscillating means comprises a pneumatic cylinder.

13. In a sample feeding apparatus for an automatic NMR spectrometer, the improvement according to claim 5 wherein the transfer member is rectangular.

14. In a sample feeding apparatus for an automatic NMR spectrometer, the improvement according to claim 5 wherein the transfer member is disk-shaped.

15. An apparatus for feeding test samples contained in rotors to an automatic NMR spectrometer comprising:
 a plurality of rotors;
 spectrometer means for generating an NMR spectrum from a sample in each of the plurality of rotors;
 at least one rotor magazine for holding each of the plurality of rotors;
 a chute for delivering sequentially each of the plurality of rotors to the spectrometer means;
 a rotor ejection apparatus for ejecting each of the rotors delivered to the spectrometer means after an NMR spectrum has been obtained;
 means for sequentially feeding the rotors one at a time from the rotor magazine to the chute having;
  a sliding transfer member provided with at least one rotor space, said rotor space being sized to hold only one rotor at a time, and
  means connected to the transfer member for repetitively oscillating the transfer member between a position with the rotor space aligned with the rotor magazine and a position where it is aligned with the chute so that a single rotor is removed from the rotor magazine and dropped into the chute during each oscillation.

16. An automatic NMR spectrometer according to claim 15 wherein the rotor magazine has a holder that holds the plurality of rotors end-to-end in a vertical stack and the sliding transfer member comprises a body with a vertical hole therethrough that allows one rotor in the rotor magazine stack to drop into the vertical hole.

17. Apparatus for sequential provision of a plurality of similarly configured rotors containing test samples to a predetermined location in an NMR spectrometer, said apparatus having means for sequentially feeding rotors one at a time to said location comprising:
 a container;
 a sliding transfer member disposed in that container and provided with at least one rotor space therein, wherein said space is configured to contain only one of the rotors;
 moving means for moving said transfer member repeatedly between first and second positions in said container;
 rotor magazine feed means connected to and opening into said container for sequentially providing the rotors to said container;
 a chute connected to said container for providing the rotors from the container to said location; and
 escape means connected to said container and aligned with said chute for providing an escape path from said container for the rotors when the rotors are returned from said location;
 wherein said space in said first position is aligned with said magazine feed means such that a rotor can be provided from said magazine feed means to said space; and
 wherein said space in said second position is aligned with said chute and with said escape means such that the rotor in the space can be provided to said chute, and such that when the rotor is returned from said chute then a substantially unrestricted path is provided for the returned rotor through said chute, said space of said member and said escape means, whereby returned objects are removed and do not block proper operation of said apparatus.

* * * * *